US012732141B2

(12) United States Patent
Yankowitz et al.

(10) Patent No.: US 12,732,141 B2
(45) Date of Patent: Sep. 8, 2026

(54) ISOLATED SWITCHING AMPLIFIER SYSTEM

(71) Applicant: Yank Technologies, Inc., Brooklyn, NY (US)

(72) Inventors: Joshua Aaron Yankowitz, Brooklyn, NY (US); Monika Chaudhari, Brooklyn, NY (US)

(73) Assignee: Yank Technologies, Inc., Brooklyn, NY (US)

(*) Notice: Subject to any disclaimer, the term of this patent is extended or adjusted under 35 U.S.C. 154(b) by 854 days.

(21) Appl. No.: 17/905,466

(22) PCT Filed: Mar. 5, 2021

(86) PCT No.: PCT/US2021/021070
§ 371 (c)(1),
(2) Date: Sep. 1, 2022

(87) PCT Pub. No.: WO2021/178790
PCT Pub. Date: Sep. 10, 2021

(65) Prior Publication Data

US 2023/0115543 A1 Apr. 13, 2023

Related U.S. Application Data

(60) Provisional application No. 62/985,692, filed on Mar. 5, 2020.

(51) Int. Cl.
*H03F 3/217* (2006.01)
*H03F 3/195* (2006.01)
(Continued)

(52) U.S. Cl.
CPC .......... *H03F 3/2176* (2013.01); *H03F 3/195* (2013.01); *H02J 50/12* (2016.02); *H02J 50/20* (2016.02)

(58) Field of Classification Search
CPC .......... H03F 3/2176; H03F 3/195; H03F 1/30; H03F 2200/447; H03F 1/565; H03F 3/217; H02J 50/12; H02J 50/20; H01F 38/14
(Continued)

(56) References Cited

U.S. PATENT DOCUMENTS 9,929,595 B2 * 3/2018 Mao .......................... H02J 50/10
2002/0145490 A1 10/2002 Sauder et al.
(Continued)

FOREIGN PATENT DOCUMENTS

CN 107078729 8/2017
JP 07-015362 1/1995
(Continued)

OTHER PUBLICATIONS

Extended European Search Report for Co-pending EP Application No. 21765406.0, Mail Date Apr. 26, 2024 11 pages.
(Continued)

*Primary Examiner* — Jessica Han
*Assistant Examiner* — Jose E Pinero
(74) *Attorney, Agent, or Firm* — Perkins Coie LLP

(57) ABSTRACT

A switching amplifier system includes an amplifier printed circuit board (PCB); a filter PCB coupled to the amplifier PCB and configured to receive an amplified signal from the amplifier PCB, and a resonant capacitor PCB coupled to the filter PCB and to one or more antennas The resonant capacitor PCB is physically separated from the amplifier PCB and the filter PCB by a distance of at least 10 mm. The filter PCB is physically separated from the amplifier PCB by a distance of at least 10 mm.

17 Claims, 7 Drawing Sheets

(51) Int. Cl.
*H02J 50/12* (2016.01)
*H02J 50/20* (2016.01)

(58) Field of Classification Search
USPC ........................................................... 330/10
See application file for complete search history.

(56) References Cited

U.S. PATENT DOCUMENTS

| | | | |
|---|---|---|---|
| 2007/0139151 | A1 | 6/2007 | Nussbaum |
| 2009/0128237 | A1 | 5/2009 | Attwood et al. |
| 2011/0241774 | A1 | 10/2011 | Nussbaum et al. |
| 2013/0069753 | A1 | 3/2013 | Kurs et al. |
| 2016/0118806 | A1 | 4/2016 | Standke et al. |
| 2018/0262050 | A1 | 9/2018 | Yankowitz |

FOREIGN PATENT DOCUMENTS

| | | |
|---|---|---|
| JP | 11-220320 | 8/1999 |
| JP | 2006-108382 | 10/2004 |
| JP | 2009-272679 | 11/2009 |
| JP | 2017-536070 | 11/2017 |
| WO | 2019/072576 | 4/2019 |

OTHER PUBLICATIONS

Byron, et al. "An MRI Compatible RF MEMs Controlled Wireless Power Transfer System" IEEE Transactions on Microwave Theory and Techniques, vol. 67, No. 5. May 2019, 10 pages.
Final Office Action for co-pending JP Application 2022-552809, dated Apr. 16, 2025, 7 pages with unofficial English translation.
ISA, International Search Report for International Application No. PCT/US2021/021070, Mail Date May 20, 2021. 15 pages.
Office Action for co-pending Canadian Application 3,174,075, dated Jan. 10, 2025, 4 pages.
CIPO, Conditional Notice of Allowance for Canadian Application No. 3,174,075, mailed on Feb. 6, 2024, 3 pages.
Office Action for co-pending JP Application 2022-552809, dated Dec. 9, 2024, 10 pages with unofficial English translation.
Office Action for co-pending KR Application 10-2022-7034631, dated Jun. 30, 2025, 6 pages with Google translation.
Second Office Action for co-pending Korean Patent Application No. 10-2022-7034631, dated Mar. 30, 2026, 10 pages with unofficial English translation.
Communication under Rule 71(3) EPC for European Application No. 21 765 406.0, mailed on Feb. 20, 2026, 8 pages.
IP Australia, Examination Report for Australian Application No. 2021232033, mailed on Oct. 31, 2025, 5 pages.
First Examination Report for co-pending Indian Patent Application No. 202247052542, dated May 11, 2026, 7 pages.

* cited by examiner

ISOLATED SWITCHING AMPLIFIER SYSTEM

RELATED APPLICATIONS

This patent document is a 371 National Phase Application of PCT Application No. PCT/US2021/021070 entitled "ISOLATED SWITCHING AMPLIFIER SYSTEM" filed on Mar. 5, 2021, which claims priority to and benefit from U.S. Provisional Patent Application No. 62/985,692, entitled "ISOLATED SWITCHING AMPLIFIER SYSTEM," filed on Mar. 5, 2020, which is hereby incorporated by reference in its entirety.

TECHNICAL FIELD

The present document relates to electrical circuits, and in particular electrical power amplifiers.

BACKGROUND

In recent years, products that allow wireless charging of electronic equipment have gained popularity. Future trend may be that practically any equipment that operates using battery power, may be wirelessly charged.

BRIEF SUMMARY

Various designs of isolated switching amplifier systems are described. The designs may be incorporated into wireless power charging devices.

In one example aspect, the disclosed technology provides a system and method for isolating components of radio frequency (RF) amplifier systems (e.g., switching class D and class E amplifier-based systems) for operational and thermal stability including techniques to isolate amplifier printed circuit boards (PCBs) from one or more filter PCBs, resonant capacitor PCBs, and antennas to reduce hysteresis losses, switching losses, and/or thermal losses.

In one example aspect, a switching amplifier system is described. The system includes an amplifier printed circuit board (PCB); a filter PCB coupled to the amplifier PCB and configured to receive an amplified signal from the amplifier PCB, wherein the filter PCB is physically separated from the amplifier PCB by a distance of at least 10 mm; a resonant capacitor PCB coupled to the filter PCB and to one or more antennas, wherein the resonant capacitor PCB is physically separated from the amplifier PCB and the filter PCB by a distance of at least 10 mm, wherein the resonant capacitor PCB is configured to receive a filtered signal from the filter PCB and drive the filtered signal onto the one or more antennas, and wherein the filtered signal is generated by filtering the amplified signal through a radio frequency (RF) filter in the filter PCB, and wherein the physical separation distance between the filter PCB, the amplifier PCB, the resonant capacitor PCB, and the one or more antennas is selected to reduce at least one of a hysteresis loss, a switching loss, or a thermal loss of the switching amplifier system.

In another example aspect, a method for fabricating a wireless charging system is disclosed. The method includes attaching an amplifier printed circuit board (PCB) to a first area of an electrically non-conductive support structure; attaching a filter PCB to a second area of the support structure, wherein the filter PCB is electrically coupled to the amplifier PCB and is configured to receive an amplified signal from the amplifier PCB; attaching a resonant capacitor PCB to a third area of the support structure, wherein the resonant capacitor PCB is electrically coupled to the filter PCB and to one or more antenna coils and is configured to receive a filtered signal from the filter PCB and drive the filtered signal onto the one or more antenna coils, wherein the first area, the second area, and the third area of the support structure are selected to maintain a physical separation between the amplifier PCB, the resonant capacitor PCB, the filter PCB, and the one or more antenna coils, and wherein a distance of the physical separation between the filter PCB and the amplifier PCB, and a distance of the physical separation between the filter PCB and the resonant capacitor PCB is at least 10 mm.

In yet another aspect, another method for fabricating a wireless charging system is disclosed. The method includes attaching an amplifier printed circuit board (PCB) to a first area of a first support structure, wherein the first support structure is electrically non-conductive; attaching a first filter PCB to a second area of the first support structure, wherein the first filter PCB is electrically coupled to the amplifier PCB and is configured to receive an amplified signal from the amplifier PCB, and wherein the first area and the second area of the first support structure are selected to maintain a physical separation distance of at least 10 mm between the amplifier PCB and the first filter PCB; attaching a resonant capacitor PCB to a second support structure, wherein the second support structure is separate from the first support structure, wherein the resonant capacitor PCB is electrically coupled to the first filter PCB and to one more antenna coils, and wherein a distance of a physical separation between the resonant capacitor PCB and the first filter PCB is at least 10 mm.

These, and other, aspects are disclosed throughout the document.

DETAILED DESCRIPTION

In power amplifier design, thermal analysis of individual components and of the board layout is important for system stability. This is especially the case in the design of switching power amplifiers, including Class D and Class E amplifiers, for at least two reasons. First, the amplification of the input signal is at radio frequencies rather than line frequencies which can create substantial thermal stress on the switching components. Second, any impedance mismatches or unintended frequency shifts can lead to substantial system losses. Therefore, how radio frequency (RF) amplifiers are designed and laid out determines thermal and operational stability, particularly for switching amplifiers such as Class D and Class E amplifiers.

This document describes systems and methods for designing Radio Frequency (RF) amplifiers for thermal and operational stability. The disclosed technology is particularly applicable to switching amplifiers, including Class D and Class E amplifiers.

Various embodiments will now be described. The following description provides specific details for a thorough understanding and an enabling description of these embodiments. One skilled in the art will understand, however, that the disclosed techniques can be practiced without many of these details. Additionally, some well-known structures or functions may not be shown or described in detail, to avoid unnecessarily obscuring the relevant description of the various embodiments. The terminology used in the description presented below is intended to be interpreted in its broadest reasonable manner, even though it is being used in conjunction with a detailed description of certain specific embodiments of the invention.

Figure 1:
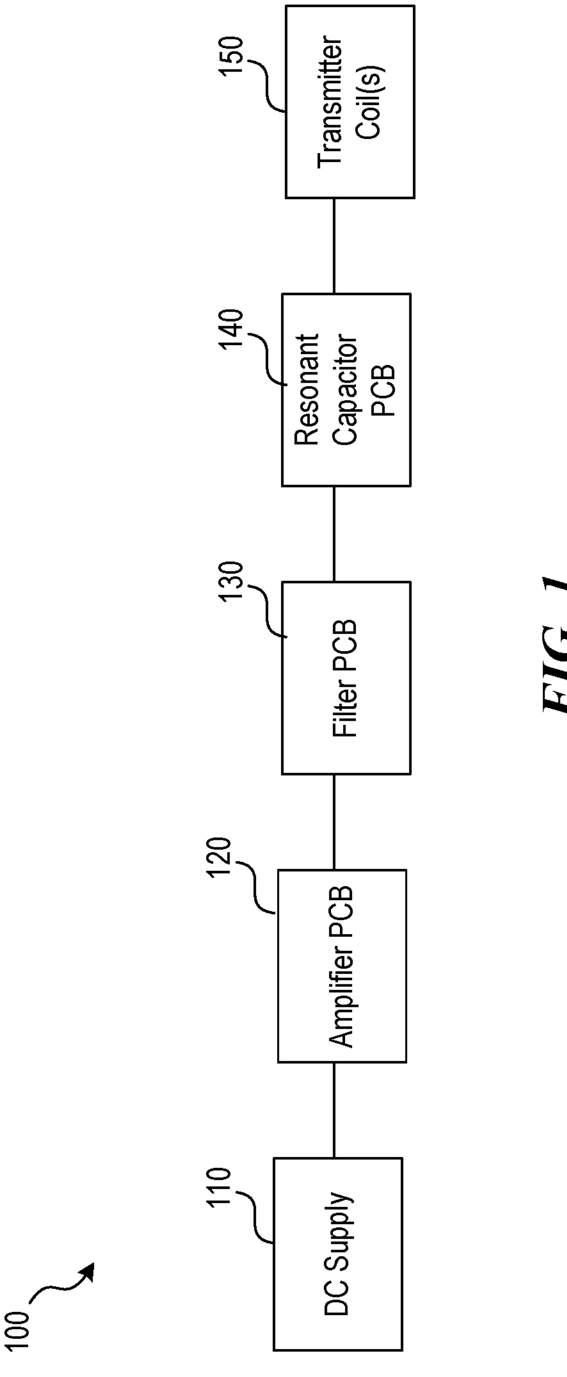
FIG. 1 is a representative block diagram of an isolated switching amplifier system.

FIG. 1 is a representative system 100 of an isolated switching amplifier system. System 100 depicts isolation of amplifier components according to one embodiment of the disclosed technology. For example, system 100 depicts the physical separation of direct current (DC) supply 110, amplifier PCB 120, filter PCB 130, resonant capacitor PCB 140, and one or more transmitter coils 150. In some embodiments, there can be a PCB between the DC supply, AC/DC charger, or rechargeable battery and the amplifier PCB in order to provide various differing voltages to appropriately drive the system, such as the logic circuitry, switching circuitry, and fans for active cooling. That is, a Power PCB can be used that applies different voltages needed for the amplifier that can have a DC jack for an AC/DC charger. In some embodiments using a differential topology, two separate filter PCBs 130 can be used, one for each differential line. This physical separation reduces thermal stress in the system 100 components (e.g., in the amplifier PCB 120) because of a lower coupling of high voltage spikes across the passive components in system 100. The isolation resulting from physical separation also reduces hysteresis losses in inductive components for RF signals. This is especially important for wireless charging systems employing these amplifier topologies because the magnetic field from the transmitter antennas can induce hysteresis losses for these inductive components. In some embodiments the physical separation distance between the filter PCB 130 and the amplifier PCB 120 is at least 10 mm and the distance between filter PCB 130 and resonant capacitor PCB 140 or antenna (transmitter coils) 150 is at least 10 mm. The separation distances are selected to reduce the hysteresis losses, switching losses, and/or a thermal losses of isolated switching amplifier system 100. System 100 can be used in a loosely-coupled wireless charging system configured to provide wireless power to an electronic device such as a cellphone or tablet. In some embodiments the separation distance is nominally around 10 mm but no closer than around 5 mm.

In some embodiments, during fabrication of isolated switching amplifier system 100, the degree of isolation can be determined by monitoring the temperature across the components of the switching amplifier system. The losses described above can be thermally visualized across the components and from the additional current drawn from the DC supply 110. The physical isolation or spacing between components can then be determined based on the clearance available in the packaging and the minimum spacing required to maintain the lowest possible thermal properties (e.g., increase isolation to decrease temperature until a target temperature is met or until constrained by packaging constraints). For example, where the filters are within less than 1 inch of the antennas, the parallel inductors are at about ~230 degrees F. for about a 20 Watt output. If the separation distance is increased by more than an inch the losses can be substantially reduced (e.g., in a system like depicted in FIG. 5 for a vehicle application where there may be more room to physically isolate components). In such a system, the temperature can be as low as around 100 degrees F. or even at room temperature for the same 20 W output. The isolation distance required for low thermal gradient depends on, inter alia, the output power and the antenna construction (which determines the magnetic field strength). Increasing the output from 20 W to 25 W, can require an increase in the isolation spacing to maintain the thermal gradients. The placement of the antennas also affects the thermal gradients (e.g., because of cross-coupling). There are also substantially reduced losses by the isolations created by physically separating the boards. The switching circuitry, such as the transistors for the amplifier, can also reduce their operating temperature from 150 degrees F. or higher to ambient temperature by the physical separation from the filters.

Figure 2:
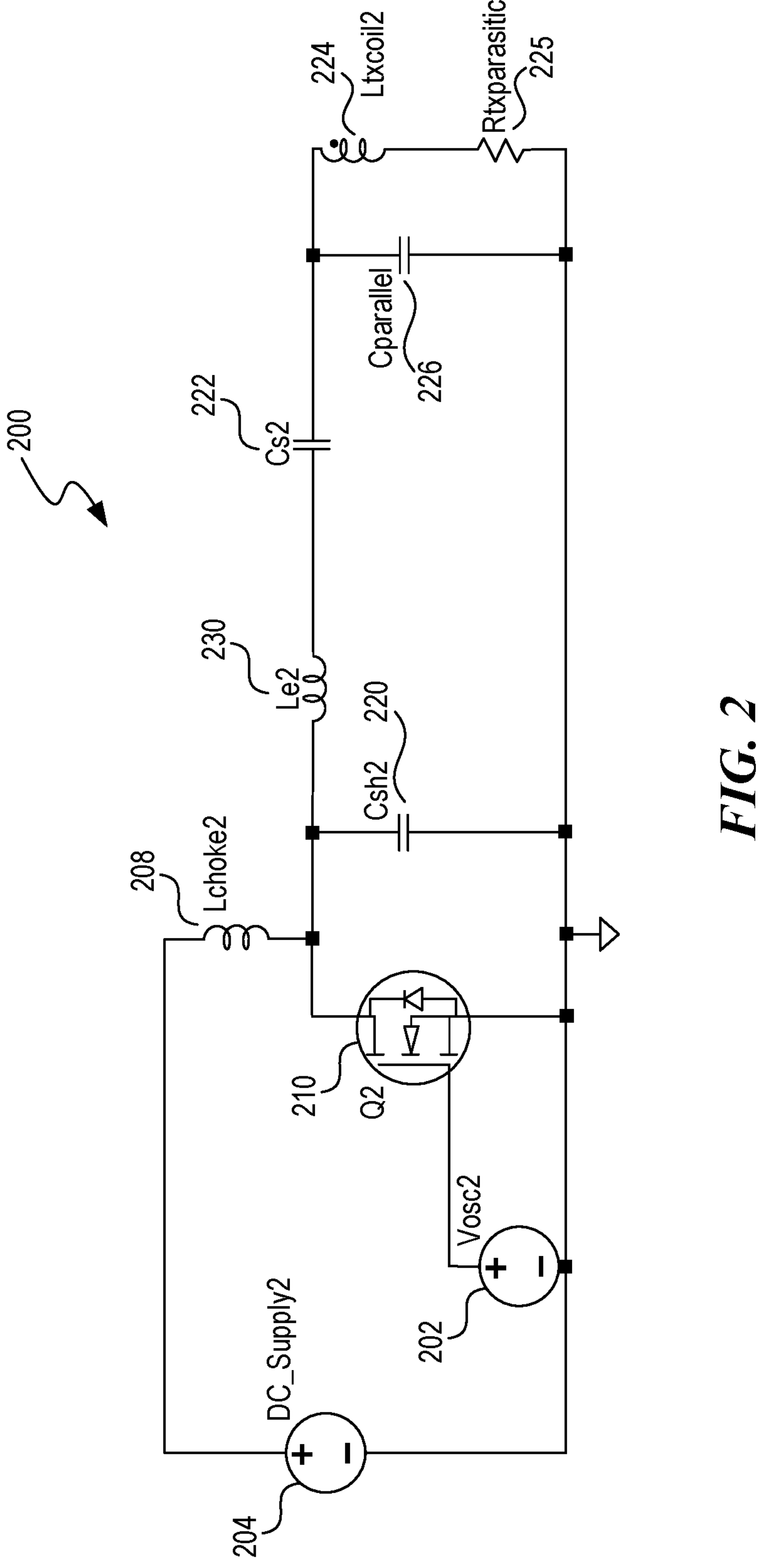
FIG. 2 is a representative schematic of a parallel-tuned class E amplifier.

FIG. 2 is a representative schematic of a single-ended Class E amplifier 200 with a parallel tuned resonant network. In FIG. 2, an oscillator and gate driver integrated circuit (Vosc2) 202 can generate a signal (e.g., a square wave) at a desired resonant frequency. The signal is applied to the gate of a transistor 210. In some embodiments, the signal can be generated by a gate driver and oscillator integrated circuit and can be adjusted with dead-time circuitry (not shown in FIG. 2), such as a diode and resistor, to better tune and adjust current and voltage waveforms of amplifier 200 for zero-voltage-switching (ZVS). Amplifier 200 can also include a choke inductor (Lchoke2) 208 to protect the dc supply 204, a shunt capacitor (Csh2) 220, and an extra series inductor (Le2) 230.

Vosc 202 signal generator circuit generates a periodic signal that the Class E amplifier 200 boosts or amplifies. The amplifier 200 has a series capacitor (CS2) 222 to tune out the inductive reactance of the extra inductor (Le2) 230 at the desired resonant frequency of the signal generated by Vosc2 202. The series capacitor (CS2) 222 together with Le2 230 act as a series resonant filter, making the design more robust by reducing harmonics. Amplifier 200 also includes a parallel capacitor (Cparallel) 226 placed in parallel with the transmitter antenna (e.g., a transmitter coil) represented by an inductance Ltxcoil 224 and a parasitic resistance Rtx-parasitic 225. Because the parallel capacitor (Cparallel) 226 excites the transmitter antenna, a transmitter device containing amplifier 200 is not dependent on a reflected real impedance of a receiver device for operation.

A load network for the amplifier 200, composed of shunt capacitor (Csh2) 220, RF choke (Lchoke2) 208, and extra inductor (Le2) 230, is tuned such that current and voltage waveforms are out-of-phase from one another, resulting in zero-voltage-switching (ZVS) of transistor 210 which greatly reduces the power dissipated across the transistor 210. When the load network is properly tuned, the voltage across transistor 210 is minimized when the switch is "closed" and the current across the transistor 210 is minimized when the switch is "open." This can improve the power efficiency of amplifier 200 to more than 90% efficiency, making such class E amplifier topologies suitable for wireless power transfer and other applications where system efficiency is an important design criteria. However, in practice, achieving such efficiencies can be difficult because switching losses, hysteresis losses in passive components, and other thermal losses in the system. This is true for both the single-ended parallel tuned resonant Class E system shown in FIG. 2, as well as any other high efficiency switching topology where the transistor acts as the main switching component, including differential parallel tuned systems, single-ended and differential Class E series resonant and off-resonant systems, and Class D off-resonant and resonant systems. That is, it will be understood that the parallel tuned single-ended amplifier described here is just a representative embodiment and the same isolation techniques in the disclosed technology can be used for other amplifier topologies including other Class D or Class E topologies and series-tuned amplifier topologies.

Figure 3:
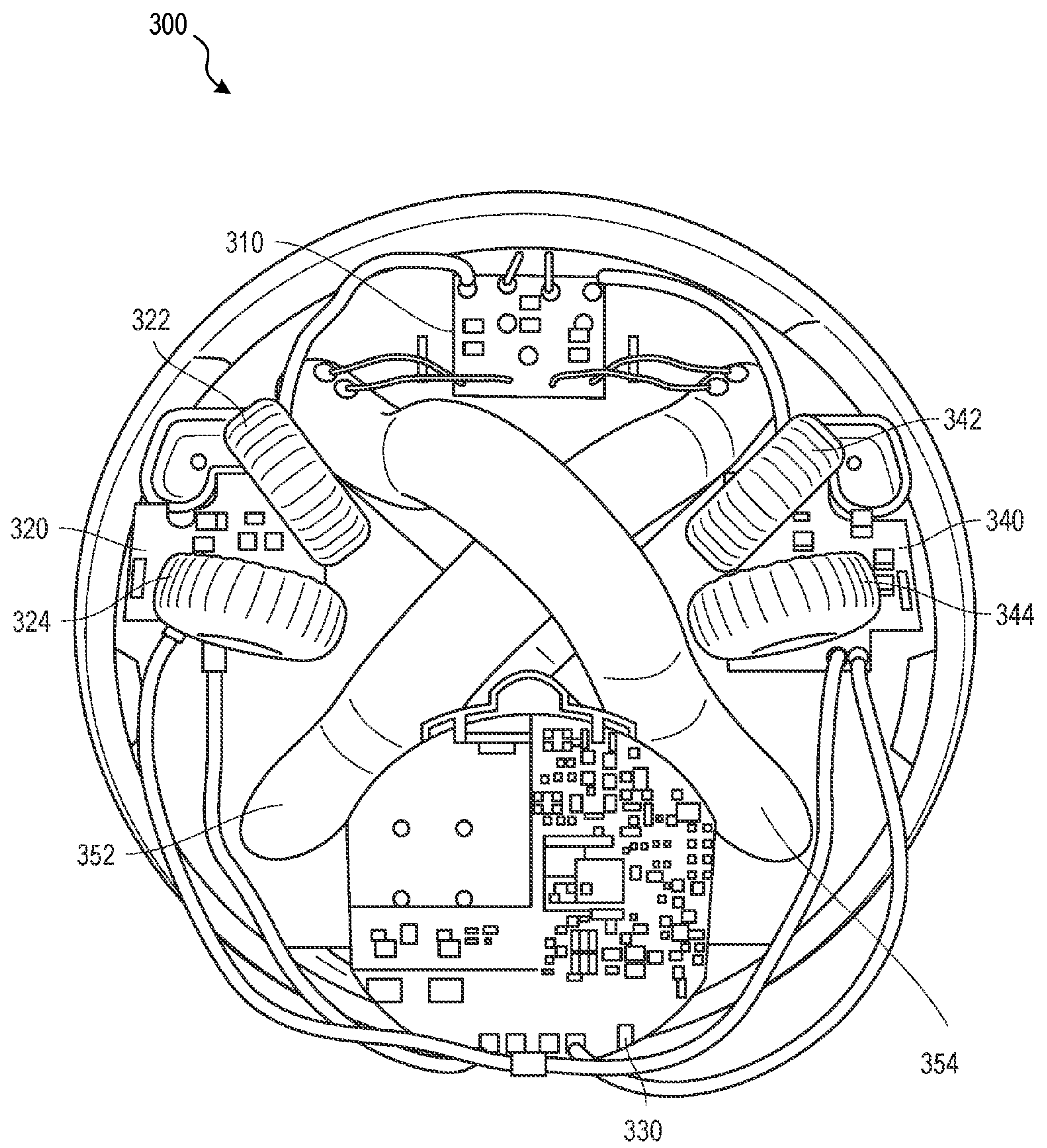
FIG. 3 is a representative layout of an isolated switching amplifier system with packaging constraints.

FIG. 3 is a representative system layout 300 of an isolated switching amplifier system with packaging constraints. The main PCB (amplifier PCB) 330 drives a signal to the filter PCBs (e.g., filter PCBs 320 and 340) which are coupled to a resonant capacitor PCB 310. The filter PCBs 320 and 340 receive an amplified signal from the amplifier PCB 330, and the resonant capacitor PCB 310 receives a filtered signal from the filter PCBs. The resonant capacitor PCB 310 is coupled to multiple antennas, e.g., transmit antenna coils 352 and 354 (only two antennas are depicted in FIG. 3 for convenience). The physical isolation of each subsystem (e.g., each PCB in system layout 300) allows the amplifier system to be more efficient with less losses due to heat. This is especially important due to the potential cross coupling between the inductors or passive components in the filter PCBs and the antennas used for a wireless charging application. Physically isolating each subsystem is particularly beneficial where there are two filter PCBs (as illustrated in FIG. 3) because of the differential output from the main/amplifier PCB 330.

Figure 4:
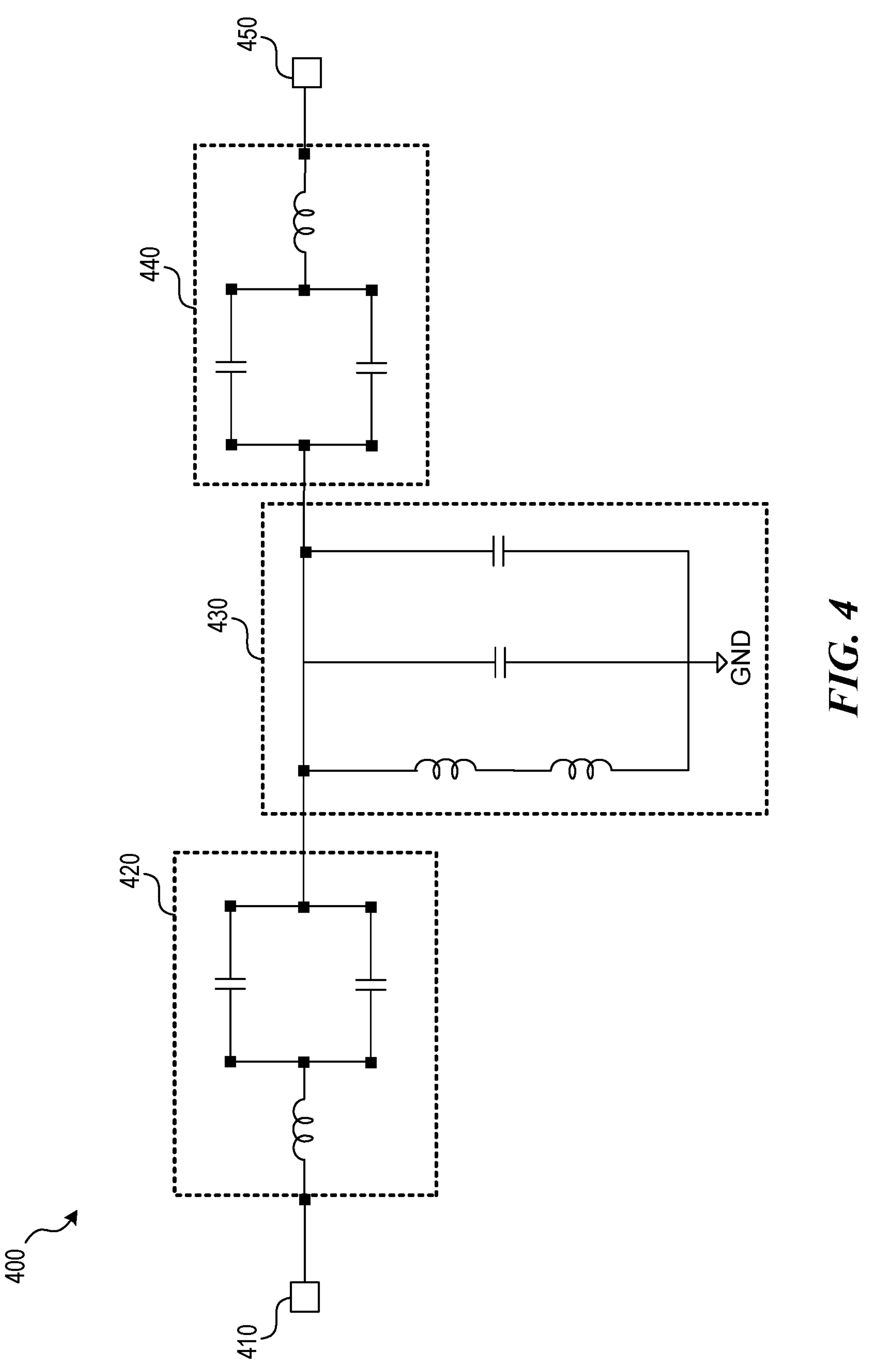
FIG. 4 is a representative schematic of a filter circuit.

In one embodiment, each radio frequency (RF) filter in filter PCB 320 and 340 can have a topology of filter 400 in FIG. 4, which includes a series inductor-capacitor network (LC) 420, coupled to a parallel LC network 430, coupled to a series LC network 440 to form a bandpass filter. The input of filter 400, input node 410, can be connected to the main PCB 330 (in FIG. 3) and the output of filter 400, output node 450, can be connected to the resonant capacitor PCB 310 (in FIG. 3). It will be appreciated that the filter configuration shown in FIG. 4 is merely representative and other filter topologies can be used in the filter PCBs 320 and 340. That is, in some embodiments, filter 400 can be configured differently depending on the attenuation desired for the harmonics of the system. For example, rather than a bandpass filter configuration, filter 400 can be configured as a series resonant filter like the one illustrated in the circuit diagram in FIG. 2. In one embodiment, the filter in filter PCB 320 and the filter in filter PCB 340 can be connected differentially.

Turning back to FIG. 3, in one embodiment of the disclosed technology, the RF filter, e.g., in filter PCB 320 and 340, is physically separated from switching components on the amplifier PCB (e.g., in main PCB 330). Physically isolating the RF filter from the switching components on the amplifier PCB lowers thermal stress on the switching components. This is especially important in the example of FIG. 3 where there is not a lot of physical clearance between the filter PCBs and the transmitter antennas due to packaging constraints. This close distance will cause higher hysteresis losses and in turn thermal losses in the filter PCBs. By having these filter PCBs then physical isolated from the amplifier PCB, it allows the amplifier PCB to operate under minimum thermal influence from the increase in temperature in the filter PCB components. In this example embodiment, the filter PCBs can be as high as 230 degrees, while the switching components can be as low as near ambient temperature.

The switching components of the amplifier include, for example, the amplifier's switching transistors (e.g., transistor 210 in FIG. 2), the switching transistor's shunt capacitors (e.g. capacitor Csh2 220 in FIG. 2), the RF choke (e.g., choke inductor Lchoke2 208), and the digital circuitry driving the switching transistors (e.g., oscillator and gate drive integrated circuit (IC) depicted as Vosc2 202 in FIG. 2). Such switching components tend to be more sensitive to heat than passive components, for example, high voltage capacitors and high power rated inductors used for various output filters and resonant capacitors. This sensitivity further underscores the importance of the physical isolation between the amplifier PCB and the filter PCBs. Additionally, such switching components tend to be more sensitive to unintended impedance and resonant frequency shifts.

In addition to isolating the RF filter from the switching components, representative layout 300 also depicts isolating the antenna resonant capacitors (e.g., resonant capacitor PCB 310) from the switching components (e.g., in main PCB 330) as well as from the RF filter components (in filter PCBs 320 and 340). In so doing, the high voltage spikes across the resonant capacitors for the antenna are better isolated.

The configuration of the amplifier into multiple isolated subsystems rather than a traditional approach using a single PCB for the amplifier components results in better operational stability and improved performance. The disclosed technology is particularly beneficial for parallel tuned resonant amplifiers (e.g., amplifier 200 of FIG. 2) where the extra series inductor used to establish the zero voltage switching waveforms (e.g., Le2 230 in FIG. 2) is also used as a filter to reduce the first and second order harmonics. These inductors can experience large hysteresis losses, greatly increasing the operating temperature (e.g., above 60 degrees Celsius). These hysteresis losses can be exacerbated by the construction of a wireless charging device because the signal from the amplifier drives one or more antennas, and the radiated signal from the antennas can couple with the inductors on the amplifier PCB (e.g., main PCB 330) and filter PCBs 320 and 340, (e.g., coupling to inductors 320, 324, 340, and 344).

The isolated subsystem of the disclosed technology allows for a greater design flexibility and improved performance by moving the amplifier PCB physically further away from the filters and the antennas driven by the amplifier in the wireless charging system. For example, in system layout 300, amplifier PCB in main PCB 330 is physically separated from antenna coils 352 and 354.

In one embodiment antenna coils (e.g., coils 352 and 354) are surface spiral coil made up of a continuous conductor with no breaks or radio frequency discontinuities. The conductor can be wound around a dielectric material at an angle to diminish the proximity effect at an operational frequency of the wireless charging transmitter device, and to maintain a high intrinsic quality factor ("Q") of the surface spiral coil at the operating frequency. The continuous conductor can have a thickness approximately of 40 um (micrometer).

In one embodiment coil 352 can be arranged on first plane (e.g., a y-axis plane) and coil 354 can be arranged on a second perpendicular plane (e.g., a x-axis plane) such that coil 352 and coil 354 are perpendicular to each other (a third coil, not shown in FIG. 3, can be in a z-axis plane perpendicular to the first and second planes). The first plane and second plane can define four quadrants. To make maximum utilization of the space on the electrically non-conductive support structure in which the different PCBs are attached, amplifier PCB 330 can be attached to the support structure in a first quadrant of the four quadrants, the first filter PCB 320 can be attached to the support structure in a second quadrant of the four quadrants, the resonant capacitor PCB 310 can be attached in a third quadrant, and the second filter PCB 340 can be attached in a fourth quadrant. These PCBs are spaced apart from each other and apart from the antenna coils to improve system performance.

In some embodiments, to fabricate the isolated wireless charging system, the main or amplifier PCB 330 is attached to a first area of an electrically non-conductive support structure (e.g., a first quadrant defined by the intersecting planes in which the antenna coils are arranged); the first filter PCB 320 is attached to a second area of the support structure (e.g., a second quadrant), the resonant capacitor PCB 310 is attached to a third area (e.g., a third quadrant), and the second filter PCB 340 is attached to a fourth area of the support structure (e.g., a fourth quadrant). The first, second, third, and fourth areas of the support structure are selected to maintain a physical separation between the amplifier PCB 330, the resonant capacitor PCB 310, the filters PCBs 320 and 340, and the coils 352 and 354. It will be appreciated that the above description is merely a representative example and other techniques may be utilized to optimize the placement of the various PCBs within a physically constrained area (e.g., when the wireless charging system is integrated in small form-factor devices). For example, for placement of three PCBs around a circumference of an approximately circular device, optimal spacing could be achieved with different component placement (optimal placement being the placement in which a collective radiative and conductive cross-coupling between components is the lowest). It may turn out, for example, that placing the components 120 degrees apart may not be the most optimal option and adjustments may be needed to optimally place the components. For example, the first and second PCBs can be placed 90 degrees apart in a clockwise direction, and the third PCB can be another 150 degrees (or 135 or 180 degrees) from the second PCB in a clockwise direction.

With a parallel tuned amplifier design (e.g., amplifier 200 of FIG. 2), it is often advantageous to use high intrinsic quality "Q" antennas and apply a high oscillating voltage across these high "Q" antennas for wireless power transmission. For example, the high voltages can be hundreds of volts and can even exceed 1,000 volts. In conventional systems where the resonant capacitors are placed on the same PCB as the filter components or the switching components, it can be difficult to isolate the high oscillating voltages to prevent the voltages from causing additional stress on the switching components or the filter components. Furthermore, the residual heat from passive components, such as inductors and filter capacitors, can increase the switching losses of the switching components. This can be especially difficult in systems where the amplifier drives multiple antennas of the wireless charging system. The design flexibility of the isolated subsystem of the disclosed technology makes it easy to isolate the high oscillating voltages thereby preventing the voltages from coupling with other components and increasing thermal stress of those components. This results in improve system performance. However, the resonant capacitors can also be placed on the same PCB as the filters if the high voltage spike across the capacitors for the specific application would not cause substantial design challenges.

It will be appreciated that the system layout 300 is merely representative. That is, the component layout (including the depicted physical placement of the filter PCBs 320 and 340, main PCB 330, resonant PCB 310, and coils 352 and 354) is merely representative and other embodiments can have different separation distances. Maximum physical separation between the components, e.g., between the antenna coils and the filter PCBs, is preferred given the system's form-factor constraints, for example, a 1 inch or greater separation. Additionally, although system layout 300 depicts an example differential system, the systems and methods for the disclosed technology apply equally for single-ended amplifier embodiments. Moreover, to further minimize cross coupling and hysteresis losses, shielding materials can be inserted across each subsystem. This is especially notable for physically constrained systems like illustrated in FIG. 3 because, if these components were placed on a single PCB instead of isolated methodology described here, it would be difficult to simultaneously shield the passive components of the filter and actively cool them (e.g., by having a fan for the switching components of the amplifier). FIG. 3 illustrates an example embodiment where the isolation substantially improves the thermal response and operation of the system which is challenging because of the physical proximity of the filter PCBs to the transmitter antennas which causes the filter temperature to be above ambient temperature in the enclosure versus outside the enclosure.

Figure 5:
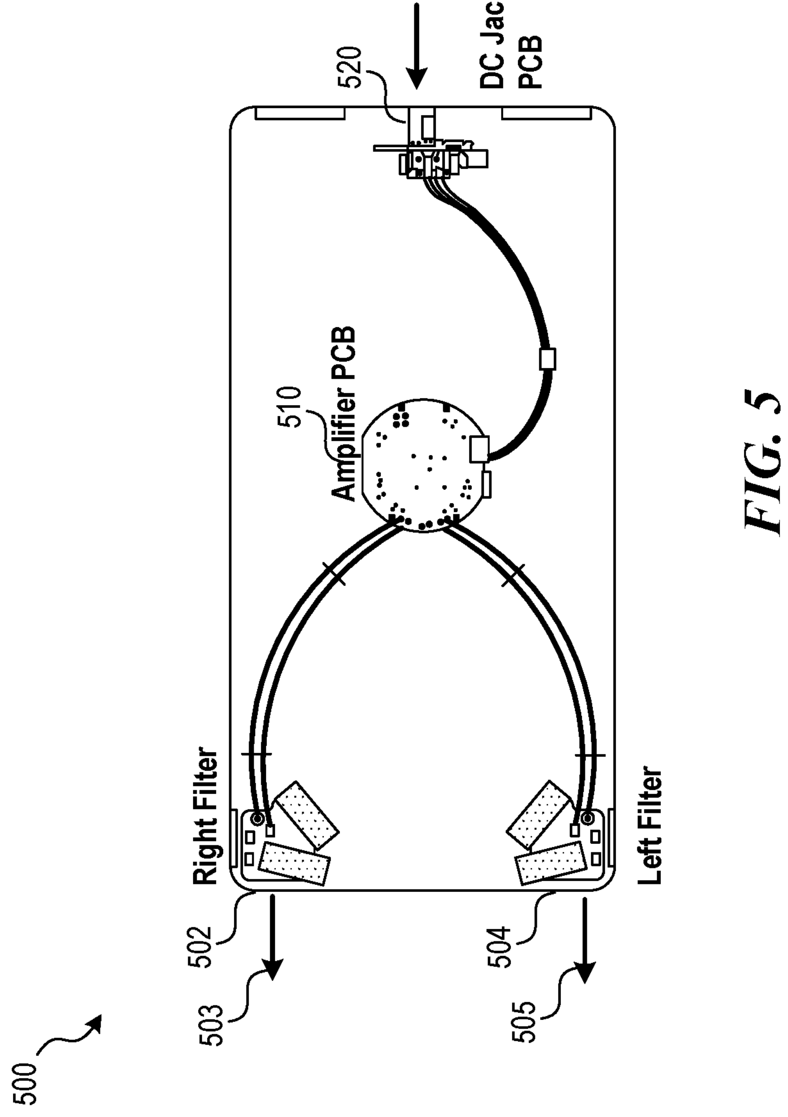
FIG. 5 is a representative layout of filters, amplifier, and DC jack PCB for an isolated switching amplifier system.

FIG. 5 is a representative system layout 500 of filters, an amplifier, and a DC jack PCB for an isolated switching amplifier system. For example, the system of FIG. 5 can represent an application of the isolated switching amplifier topology where there are no strict packaging requires (e.g., more physical room to layout components) when compared to the embodiments of FIG. 3. Layout 500 includes filter PCBs 502 and 504, amplifier PCB 510, and a separate power PCB or DC jack PCB 520 . The DC jack PCB 520 is a separate PCB that takes the input of the DC supply (e.g., output of alternating-current to direct-current (AC/DC) charger) and provides all the voltage levels necessary for the amplifier PCB 510, e.g., all the logic and power voltages for logic or power (e.g., amplifier) circuitry. The representative embodiment of FIG. 5 can include a greater degree of spacing between the filters, amplifier and DC jack PCB when, compared to the embodiment of FIG. 3. In this embodiment, there is more physical space available in the product to create more separation between the PCBs. The extra separation distance further improves overall system performance. Additionally, by not having the filter PCBs positioned towards the transmitter antenna(s) like in FIG. 3, this further improves performance by reducing cross coupling and hysteresis losses.

The arrows 503 and 505 in layout 500 indicate that the filters in the filter PCBs 502 and 504 are electrically connected to a separate resonant capacitor PCB and antenna (not shown in FIG. 5). That is, in this representative embodiment, the electrically non-conductive housing for the electronic components does not include the antennas and the resonant capacitor PCB. This is because, if there is greater physical space available in the product as shown in FIG. 5, it is more beneficial for the main PCB (e.g., amplifier PCB 510), filter PCBs (e.g., filter PCBs 502 and 504), and power PCB (e.g., DC jack PCB 520) to be physically isolated from the antenna and its resonant capacitors. The resonant capacitor PCB is also physically separated from the main, filter, and power PCBs because it is beneficial to have the resonant capacitors of the antenna physically close the antenna for high intrinsic 'Q' antenna applications. Having the resonant capacitors close to the antenna results in shorter wire runs and thus less resistance between the antenna and its corresponding resonant capacitors.

U.S. patent application Ser. No. 15/759,473 (Publication No. US2018/0262050), incorporated by reference in entirety herein, describes some example coil configurations that may use the isolation technology and the fabrication methods described herein.

A listing of solutions that is preferably implemented by some embodiments can be described using the following clauses.

Clause 1. A switching amplifier system, comprising: an amplifier printed circuit board (PCB); a filter PCB coupled to the amplifier PCB and configured to receive an amplified signal from the amplifier PCB, wherein the filter PCB is physically separated from the amplifier PCB by a distance of at least 10 mm; a resonant capacitor PCB coupled to the filter PCB and to one or more antennas, wherein the resonant capacitor PCB is physically separated from the amplifier PCB and the filter PCB by a distance of at least 10 mm, wherein the resonant capacitor PCB is configured to receive a filtered signal from the filter PCB and drive the filtered signal onto the one or more antennas, and wherein the filtered signal is generated by filtering the amplified signal through a radio frequency (RF) filter in the filter PCB, and wherein the physical separation distance between the filter PCB, the amplifier PCB, the resonant capacitor PCB, and the one or more antennas is selected to reduce at least one of a hysteresis loss, a switching loss, or a thermal loss of the switching amplifier system. Some example implementations of this system are described with reference to FIGS. 1 to 5.

Clause 2. The switching amplifier system of clause 1, wherein the amplifier PCB comprises a parallel-tuned Class E amplifier configured to amplify a periodic signal generated by a signal generator circuit.

Clause 3. The switching amplifier system of clause 1, wherein the amplifier PCB comprises a Class D or a Class E amplifier configured to amplify a periodic signal generated by a signal generator circuit.

Clause 4. The switching amplifier system of clause 1, wherein the amplifier PCB is electrically coupled to a separate power PCB and the separate power PCB is coupled to a direct current (DC) supply or an alternating-current to direct-current (AC/DC) charger output, wherein the separate power PCB is configured to provide power to logic and power circuits.

Clause 5. The switching amplifier system of clause 1, wherein the one or more antennas comprise at least one coil structured as a surface spiral coil comprising a continuous conductor with no breaks or radio frequency discontinuities wound around a dielectric material at an angle to diminish a proximity effect at an operating frequency of the switching amplifier system, and to maintain a high intrinsic quality factor (Q) of the surface spiral coil at the operating frequency.

Clause 6. The switching amplifier system of clause 5, wherein the at least two coils comprise a first surface spiral coil arrange on a first plane, and a second surface spiral coil arranged on a second plane perpendicular to the first plane.

Clause 7. The switching amplifier system of clause 6, wherein the first plane and the second plane intersect to define four quadrants, wherein the amplifier PCB is arranged in a first quadrant of the four quadrants, the filter PCB is arranged in a second quadrant of the four quadrants, and the resonant capacitor PCB is arranged in a third quadrant of the four quadrants.

Clause 8. The switching amplifier system of clause 7, further comprising a second filter PCB arranged in a fourth quadrant of the four quadrants, wherein the second filter PCB is coupled to the resonant capacitor PCB and the amplifier PCB, and wherein the second filter PCB is physically isolated from the amplifier PCB, the filter PCB, the resonant capacitor PCB, and the at least two coils.

Clause 9. The switching amplifier system of clause 1, further comprising a differential amplifier contained in the amplifier PCB, and an additional filter PCB coupled to the amplifier PCB and configured to receive an amplified signal from the amplifier PCB.

Figure 6:
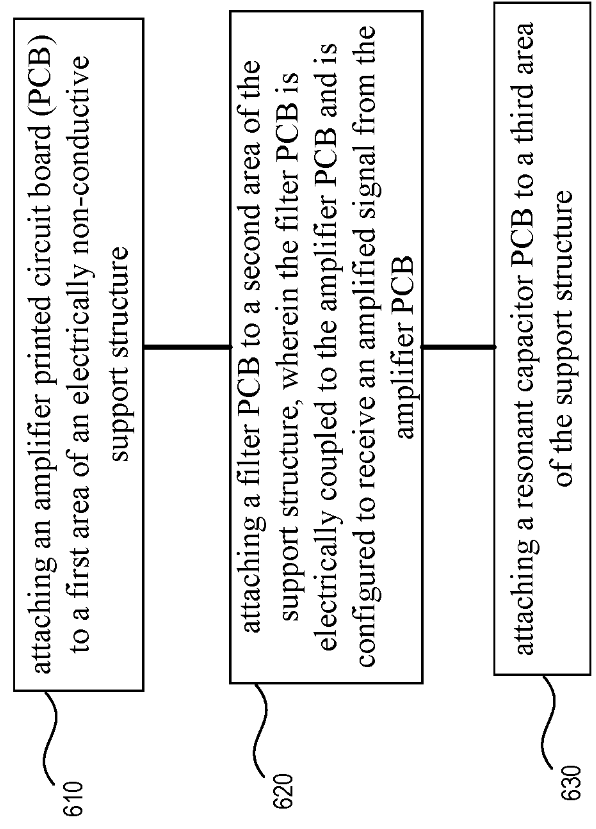
FIG. 6 depicts a flowchart for a method of fabricating a wireless charging system.

Clause 10. A method for fabricating a wireless charging system (e.g., method depicted in FIG. 6), the method comprising: attaching (610) an amplifier printed circuit board (PCB) to a first area of an electrically non-conductive support structure; attaching (620) a filter PCB to a second area of the support structure, wherein the filter PCB is electrically coupled to the amplifier PCB and is configured to receive an amplified signal from the amplifier PCB; attaching (630) a resonant capacitor PCB to a third area of the support structure, wherein the resonant capacitor PCB is electrically coupled to the filter PCB and to one or more antenna coils and is configured to receive a filtered signal from the filter PCB and drive the filtered signal onto the one or more antenna coils, wherein the first area, the second area, and the third area of the support structure are selected to maintain a physical separation between the amplifier PCB, the resonant capacitor PCB, the filter PCB, and the one or more antenna coils, and wherein a distance of the physical separation between the filter PCB and the amplifier PCB, and a distance of the physical separation between the filter PCB and the resonant capacitor PCB is at least 10 mm.

Clause 11. The method of clause 10, wherein the wireless charging system comprises a Class D or Class E amplifier configured to amplify a periodic signal generated by a signal generator circuit.

Clause 12. The method of clause 10, wherein the wireless charging system is configured to provide wireless power to an electronic device.

Figure 7:
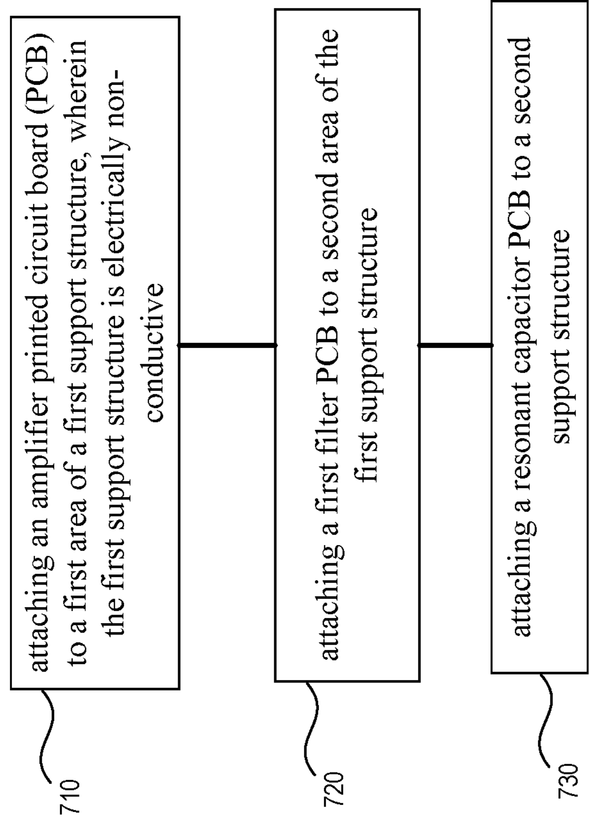
FIG. 7 depicts a flowchart for a method of fabricating a wireless charging system.

Clause 13. A method for fabricating a wireless charging system (e.g., method depicted in FIG. 7), the method comprising: attaching (710) an amplifier printed circuit board (PCB) to a first area of a first support structure, wherein the first support structure is electrically non-conductive; attaching (720) a first filter PCB to a second area of the first support structure, wherein the first filter PCB is electrically coupled to the amplifier PCB and is configured to receive an amplified signal from the amplifier PCB, and wherein the first area and the second area of the first support structure are selected to maintain a physical separation distance of at least 10 mm between the amplifier PCB and the first filter PCB; attaching (730) a resonant capacitor PCB to a second support structure, wherein the second support structure is separate from the first support structure, wherein the resonant capacitor PCB is electrically coupled to the first filter PCB and to one more antenna coils, and wherein a distance of a physical separation between the resonant capacitor PCB and the first filter PCB is at least 10 mm.

Clause 14. The method of clause 13, further comprising attaching a second filter PCB to a third area of the first support structure, wherein the first area, the second area, and the third area of the first support structure are selected to maintain a physical separation distance of at least 10 mm between the amplifier PCB, the first filter PCB, and the second filter PCB.

Clause 15. The method of clause 13, further comprising attaching a power PCB to a fourth area of the first support structure, wherein the amplifier PCB is electrically coupled the power PCB, and the power PCB is coupled to a direct current (DC) supply or an alternating-current to direct-current (AC/DC) charger output.

Clause 16. The method of clause 13, wherein the wireless charging system comprises a Class D or Class E amplifier configured to amplify a periodic signal generated by a signal generator circuit.

Clause 17. The method of clause 13, wherein the wireless charging system is configured to provide wireless power to an electronic device.

Remarks

The figures and above description provide a brief, general description of a suitable environment in which the invention can be implemented. The above Detailed Description of examples of the invention is not intended to be exhaustive or to limit the invention to the precise form disclosed above. While specific examples for the invention are described above for illustrative purposes, various equivalent modifications are possible within the scope of the invention, as those skilled in the relevant art will recognize. For example, while processes or blocks are presented in a given order, alternative implementations can perform routines having steps/blocks, or employ systems having blocks, in a different order, and some processes or blocks can be deleted, moved, added, subdivided, combined, or modified to provide alternative or sub-combinations. Each of these processes or blocks can be implemented in a variety of different ways. Also, while processes or blocks are at times shown as being performed in series, these processes or blocks can instead be performed or implemented in parallel or can be performed at different times. Further any specific numbers noted herein are only examples: alternative implementations can employ differing values or ranges. For example, in practice, an operational tolerance of up to plus-minus 10 percent may be used for implementing the disclosed embodiments.

These and other changes can be made to the claimed invention considering the above Detailed Description. While the above description describes certain examples of the claimed invention, and describes the best mode contemplated, no matter how detailed the above appears in text, the invention can be practiced in many ways. Details of the system can vary considerably in its specific implementation, while still being encompassed by the embodiments disclosed herein. As noted above, terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

The invention claimed is:

1. A switching amplifier system, comprising:

an amplifier printed circuit board (PCB);

a filter PCB coupled to the amplifier PCB and configured to receive an amplified signal from the amplifier PCB;

a resonant capacitor PCB coupled to the filter PCB and to one or more antennas, wherein the resonant capacitor PCB is physically separated from the amplifier PCB and the filter PCB by a distance of at least 10 mm, wherein the resonant capacitor PCB is configured to receive a filtered signal from the filter PCB and drive the filtered signal onto the one or more antennas, and wherein the resonant capacitor PCB is configured to apply an oscillating voltage of at least 100 Volts across the one or more antennas, wherein the physical separation between the resonant capacitor PCB and the amplifier PCB isolates the oscillating voltage from switching components on the amplifier PCB, wherein the physical separation between the filter PCB and the one or more antennas reduces hysteresis losses in one or more inductive filter components of the filter PCB caused by coupling between a radiated wireless power signal from the one or more antennas and the one or more inductive filter components, and wherein the filtered signal is generated by filtering the amplified signal through a radio frequency (RF) filter in the filter PCB.

2. The switching amplifier system of claim 1, wherein the amplifier PCB comprises a parallel-tuned Class E amplifier configured to amplify a periodic signal generated by a signal generator circuit.

3. The switching amplifier system of claim 1, wherein the amplifier PCB comprises a Class D or a Class E amplifier configured to amplify a periodic signal generated by a signal generator circuit.

4. The switching amplifier system of claim 1, wherein the amplifier PCB is electrically coupled to a separate power PCB and the separate power PCB is coupled to a direct current (DC) supply or an alternating-current to direct-current (AC/DC) charger output, wherein the separate power PCB is configured to provide power to logic and power circuits.

5. The switching amplifier system of claim 1, wherein the one or more antennas comprise at least one coil structured as a surface spiral coil comprising a continuous conductor with no breaks or radio frequency discontinuities wound around a dielectric material at an angle to diminish a proximity effect at an operating frequency of the switching amplifier system, and to maintain a high intrinsic quality factor (Q) of the surface spiral coil at the operating frequency.

6. The switching amplifier system of claim 5, wherein the at least one coil comprises a first surface spiral coil arrange on a first plane, and a second surface spiral coil arranged on a second plane perpendicular to the first plane.

7. The switching amplifier system of claim 6, wherein the first plane and the second plane intersect to define four quadrants, wherein the amplifier PCB is arranged in a first quadrant of the four quadrants, the filter PCB is arranged in a second quadrant of the four quadrants, and the resonant capacitor PCB is arranged in a third quadrant of the four quadrants.

8. The switching amplifier system of claim 7, further comprising a second filter PCB arranged in a fourth quadrant of the four quadrants, wherein the second filter PCB is coupled to the resonant capacitor PCB and the amplifier PCB, and wherein the second filter PCB is physically isolated from the amplifier PCB, the filter PCB, the resonant capacitor PCB, and the at least one coil.

9. The switching amplifier system of claim 1, further comprising a differential amplifier contained in the amplifier PCB, and an additional filter PCB coupled to the amplifier PCB and configured to receive an amplified signal from the amplifier PCB.

10. A method for fabricating a wireless charging system, the method comprising:

attaching an amplifier printed circuit board (PCB) to a first area of an electrically non-conductive support structure;

attaching a filter PCB to a second area of the support structure, wherein the filter PCB is electrically coupled to the amplifier PCB and is configured to receive an amplified signal from the amplifier PCB;

attaching a resonant capacitor PCB to a third area of the support structure, wherein the resonant capacitor PCB is electrically coupled to the filter PCB and to one or more antenna coils and is configured to receive a filtered signal from the filter PCB and drive the filtered signal onto the one or more antenna coils, wherein the first area, the second area, and the third area of the support structure are selected to maintain a physical separation between the amplifier PCB, the resonant capacitor PCB, the filter PCB, and the one or more antenna coils, wherein a distance of the physical separation between the filter PCB and the resonant capacitor PCB is at least 10 mm, wherein the resonant capacitor PCB is configured to apply an oscillating voltage of at least 100 Volts across the one or more antenna coils, wherein the physical separation between the resonant capacitor PCB and the amplifier PCB isolates the oscillating voltage from switching components on the amplifier PCB, wherein the physical separation between the filter PCB and the one or more antenna coils reduces hysteresis losses in one or more inductive filter components of the filter PCB caused by coupling between a radiated wireless power signal from the one or more antenna coils and the one or more inductive filter components.

11. The method of claim 10, wherein the wireless charging system comprises a Class D or Class E amplifier configured to amplify a periodic signal generated by a signal generator circuit.

12. The method of claim 10, wherein the wireless charging system is configured to provide wireless power to an electronic device.

13. A method for fabricating a wireless charging system, the method comprising:

attaching an amplifier printed circuit board (PCB) to a first area of a first support structure, wherein the first support structure is electrically non-conductive;

attaching a first filter PCB to a second area of the first support structure, wherein the first filter PCB is electrically coupled to the amplifier PCB and is configured to receive an amplified signal from the amplifier PCB;

attaching a resonant capacitor PCB to a second support structure, wherein the second support structure is separate from the first support structure, wherein the resonant capacitor PCB is electrically coupled to the first filter PCB and to one more antenna coils, and wherein a distance of a physical separation between the resonant capacitor PCB and the first filter PCB is at least 10 mm, wherein the resonant capacitor PCB is configured to apply an oscillating voltage of at least 100 Volts across the one or more antenna coils, wherein the physical separation between the resonant capacitor PCB and the amplifier PCB isolates the oscillating voltage from switching components on the amplifier PCB, wherein the physical separation between the filter PCB and the one or more antenna coils reduces hysteresis losses in one or more inductive filter components of the filter PCB caused by coupling between a radiated wireless power signal from the one or more antenna coils and the one or more inductive filter components.

14. The method of claim 13, further comprising attaching a second filter PCB to a third area of the first support structure, wherein the first area, the second area, and the third area of the first support structure are selected to maintain a physical separation distance of at least 10 mm between the amplifier PCB, the first filter PCB, and the second filter PCB.

15. The method of claim 13, further comprising attaching a power PCB to a fourth area of the first support structure, wherein the amplifier PCB is electrically coupled the power PCB, and the power PCB is coupled to a direct current (DC) supply or an alternating-current to direct-current (AC/DC) charger output.

16. The method of claim 13, wherein the wireless charging system comprises a Class D or Class E amplifier configured to amplify a periodic signal generated by a signal generator circuit.

17. The method of claim 13, wherein the wireless charging system is configured to provide wireless power to an electronic device.

* * * * *